US005477460A

United States Patent [19]
Vakirtzis et al.

[11] Patent Number: 5,477,460
[45] Date of Patent: Dec. 19, 1995

[54] EARLY HIGH LEVEL NET BASED ANALYSIS OF SIMULTANEOUS SWITCHING

[75] Inventors: Charles K. Vakirtzis, New Windsor; George A. Katopis; Gerald W. Mahoney, both of Poughkeepsie; Craig R. Selinger, Spring Valley; Bradley D. McCredie, Poughquag; Wiren D. Becker, Hyde Park, all of N.Y.

[73] Assignee: International Business Machines Corporation, Armonk, N.Y.

[21] Appl. No.: 360,519

[22] Filed: Dec. 21, 1994

[51] Int. Cl.⁶ ............................................. G06F 17/50
[52] U.S. Cl. ........................... 364/489; 364/488; 364/578
[58] Field of Search ................................ 364/488, 489, 364/490, 491, 578

[56] References Cited

U.S. PATENT DOCUMENTS

| | | | |
|---|---|---|---|
| 4,594,677 | 6/1986 | Barlow | 364/578 |
| 4,644,265 | 2/1987 | Davidson et al. | 324/73 R |
| 5,066,873 | 11/1991 | Chan et al. | 307/443 |
| 5,111,413 | 5/1992 | Lazansky et al. | 364/578 |
| 5,142,167 | 8/1992 | Temple et al. | 307/443 |
| 5,198,986 | 3/1993 | Ikeda et al. | 364/489 |
| 5,243,547 | 9/1993 | Tsai et al. | 364/578 |
| 5,258,932 | 11/1993 | Matsuzaki | 364/578 |
| 5,260,881 | 11/1993 | Agrawal et al. | 364/489 |
| 5,305,229 | 4/1994 | Dhar | 364/489 |
| 5,349,542 | 9/1994 | Brasen et al. | 364/578 |

OTHER PUBLICATIONS

A. Brown, et al. "Delta–I Simultaneous Switching", IBM Technical Disclosure Bulletin V27 N4A, Sep. 1984, pp. 2048–2053.

*Primary Examiner*—Vincent N. Trans
*Assistant Examiner*—Susan Wieland
*Attorney, Agent, or Firm*—Whitham, Curtis, Whitham & McGinn; Alison Mortinger

[57] ABSTRACT

Switching characteristics of system components are represented and summed so that their effects on the overall system can be observed during the design process. Full simultaneous switching analysis is provided at the earliest levels of design containing minimal level of design data by a method of computing net based simultaneous switching noise levels which supports packages ranging from the smallest chip level to the largest board level. The simultaneous switching activity is computed based on interaction between each driver and each other driver between each component and each other component, with consideration to the spatial inter-relationship net, within a higher level component, to determine each component's drivers effect on itself as well as the coupling effect between drivers on different components. The analysis involves computing simultaneous switching noise by associating a characteristic triangle with each driver application configuration. The characteristic triangle. The height of the triangle, as well as the pitch of the sides of the triangle will be determined by the characteristics of the net. In the early stages of design, a default characteristic triangle is defined for each technology type. A general triangle is also defined for cases where early analysis needs to be performed prior to choosing a technology.

10 Claims, 6 Drawing Sheets

$a = L_{coupling} * di/dt$, in mili-volts
$b = d * T_r$, in units of time
$c = e * T_r$, in units of time
d is a value between 0.75 and 1.0
e is a value between 1.0 and 2.0
$T_r$ is the driver rise time
$L_{coupling}$ = net coupled inductance

EARLY HIGH LEVEL NET BASED ANALYSIS OF SIMULTANEOUS SWITCHING

DESCRIPTION

BACKGROUND OF THE INVENTION

1. Field of the Invention

The present invention generally relates to design tools used in the design of complex electronic systems including a large number of switching devices, such as are found in modern high speed computer systems and components, and more particularly to a computer implemented method for high level analysis of simultaneous switching in order to compute noise in the earliest phases of design with minimal amounts of design data.

2. Description of the Prior Art

Simultaneous switching is one form of noise that can exist in switching circuits. It is caused by a significant number of drivers switching at the same time or within the same time window. The result is an increased current draw on the power supply. In some cases, this increased current draw can cause a dip or negative spike in the voltage supply to the chip. This dip in power supply voltage can propagate as noise through both active and quiet drivers. In a worst case scenario, an extreme power supply dip can prevent all circuits on a chip from functioning properly.

The higher the loop inductance of a package's power distribution, the more susceptible it is to simultaneous switching noise, and thus the more critical simultaneous switching analysis becomes. The noise margin or noise immunity is the measure of noise tolerance of a characteristic set of nets and drivers on a package. The larger the noise tolerance, the greater the amount of noise that can be withstood without adverse effects.

All of the concerns listed above apply equally to any semiconductor technology. The amount of noise generated is primarily determined by the device current switching rate. The higher di/dt causes larger noises and thus additional concerns about the compounded effects of this noise. With system speeds increasing from values on the order of 10 Mhz (megahertz) to the order of 100 Mhz, concerns about destructive simultaneous switching noise increase.

Noise, in general, can cause false switching. For the purpose of completeness, a brief explanation and example will be included here, demonstrating how simultaneous switching noise can cause false switching. Consider the simple case of an output gate array feeding an inverter as shown in FIG. 1A. The output voltage from the gate array of combinatorial logic gates at steady state is well defined for a known technology. If there were no noise, the input logic "1" to the inverter would be nearly the same as the output logic "1" from the gate array, as shown in FIG. 1B. Likewise, the logic "0" input to the inverter would be nearly the same level as the output logic "0" from the gate array. Note in FIG. 1B that the dotted shaded areas represent valid signal levels, both at the output of the array of gates, and at the input of the inverter. The cross hatched intermediate zone indicates that voltage levels are not sufficiently high or low to insure valid switching or maintain a desired state of the inverter receiver. Due to simultaneous switching noise, the actual level of the logic "1" reaching the inverter may be lower than the output from the gate array. Likewise, the logic "0" arriving at the inverter may be greater than the maximum logic "0" transmitted by the gate array. The difference between the lowest logic transmitted by the gate array and the minimum logic "1" acceptable to the inverter is the high input voltage noise margin. The difference between the highest logic "0" transmitted from the gate array and the highest logic acceptable by the inverter input is the low input voltage noise tolerance. When the logic "1" arriving at the inverter is less than the minimum allowable logic "1", that is defined by the logic high input range, the output state of the inverter can not be guaranteed, and the receiver may interpret its input as a logic "0". Likewise, if the logic "0" arriving at the inverter were to be greater than the maximum allowable, as defined by the logical "0" low input range, then the receiver state will become indeterminate and may perceive its input as a logic "1". Whenever the steady state signal may enter the hatched intermediate zone, false switching may occur, and the current state is indeterminate.

As design performance is regularly pushed to new limits, more and more data needs to be transmitted faster and faster. With faster drivers, the potential for false switching due to induced simultaneous switching noise increases. Likewise, greater amounts of data need to be transmitted in the present aggressive design environment causing bus widths to continue to grow and further aggravating the simultaneous switching noise problem. The importance of simultaneous switching noise analysis continues to increase. In an effort to cut design times and bring products to market more swiftly, key analysis functions need to be made available earlier in the product design cycle. Simultaneous switching noise analysis has become increasingly important in product design. In an effort to maximize design efficiency, this analysis needs to be applied in the earliest stages or the product design cycle. The earlier this analysis is applied to a design, the sooner noise problems and be resolved, and perhaps prevented before they occur.

No existing software provides any means of computing simultaneous switching for early high level design. Existing simultaneous switching programs compute noise based on chips or components. This approach does not provide sufficient accuracy for today's higher speed clock requirements.

SUMMARY OF THE INVENTION

It is therefore an object of the present invention to provide a way of representing and summing switching characteristics of system components so that their effects on the overall system can be observed during the design process.

It is another object of the invention to provide full simultaneous switching analysis at the earliest levels of design containing minimal level of design data.

It is a further object of the invention to provide a method of computing net based simultaneous switching noise levels which supports packages ranging from the smallest chip level to the largest board level.

It is yet another object of the invention to provide a method of calculating noise for a large number of noise sources in a minimal computational manner.

According to the invention, there is provided simultaneous switching analysis support across the full spectrum of levels of design from the earliest high level design specification to the complete design specification and at any level of physical package design hierarchy. The simultaneous switching activity is computed based on interaction between each driver and each other driver between each component and each other component, with consideration to the spatial inter-relationship net, within a higher level component, to determine each component's driver's effect on itself as well as the coupling effect between drivers on different components.

The method according to the invention involves computing simultaneous switching noise by associating a characteristic triangle with each driver application configuration. An application configuration is a driver in a specific usage environment, including the receiver, terminator and package wiring characteristics. The characteristic triangle will roughly describe the driver's switching effect. It is essentially an approximate model of the driver's current flow over a short time during its transient stage. Each driver within the scope of the current analysis boundary will have a characteristic triangle. The height of the triangle, as well as the pitch of the sides of the triangle will be determined by the characteristics of the net. In the early stages of design, a default characteristic triangle is defined for each technology type. A general triangle is also defined for cases where early analysis needs to be performed prior to choosing a technology. The approximate switching time for each driver is a required input to the simultaneous switching process. This value is a major factor in deriving the shape of the characteristic triangle in terms of its variables. These values are derived from the switching curve of each driver type.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The primary gauge of simultaneous switching is the number of drivers that are switching at any given instant in time and the magnitude of the time rate of change of current drawn and the magnitude of current drawn. A switching effect model can be associated with each driver based on its application. When detailed driver, receiver and terminator designs are available, these effect models can be assessed by doing detailed circuit analysis. By modeling the driver(s), receiver(s), terminator(s) and transmission line characteristics, a relative switching effect model can be computed. In an early analysis mode of simultaneous switching analysis, assumptions will need to be made regarding the driver, receiver and terminator types and general net characteristics.

In the past, simultaneous switching analysis was generally performed on a component by component basis. This was acceptable with slower cycle times and smaller chips. As system cycle times continue to decrease and chip sizes continue to increase, this method may no longer provide meaningfully accurate results. A new method involving net based computations is introduced and implemented here. This method provides greater accuracy that will have value for early high level analysis as well as detailed design analysis.

Figure 1A:
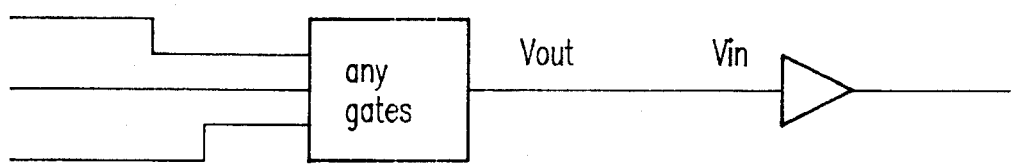
FIG. 1A is a block and schematic diagram showing an array of gates feeding an inverter used to describe a simultaneous switching example.
Figure 1B:
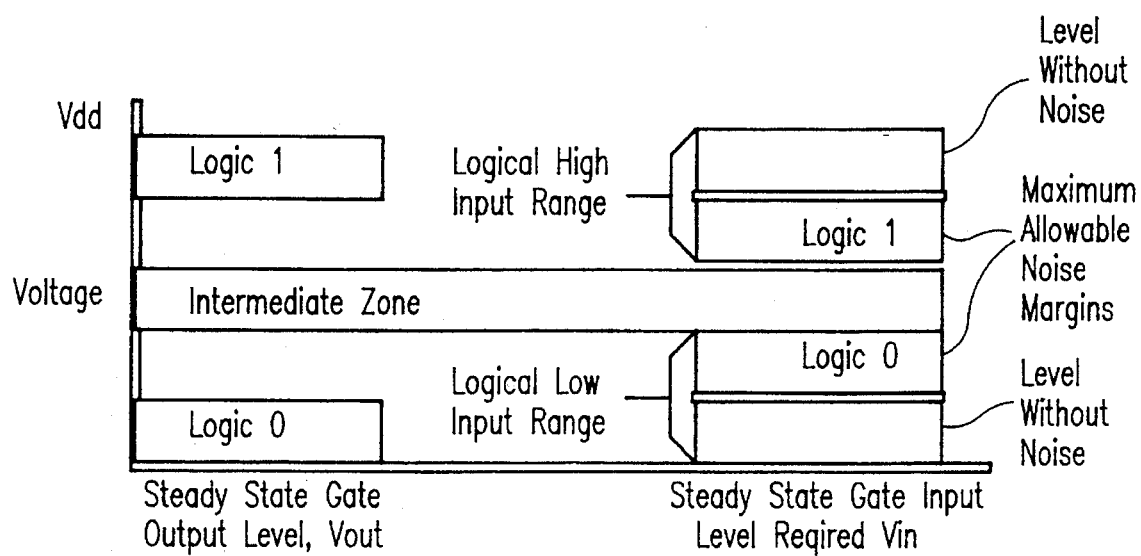
FIG. 1B is a graph showing the voltage levels defining logic "1" and logic "0" for the example shown in FIG. 1A.
Figure 2:
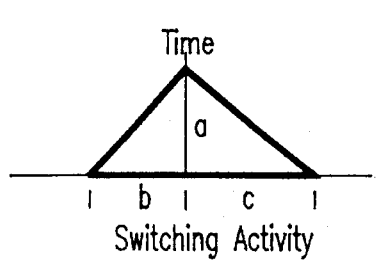
FIG. 2 is a geometric representation of the characteristic switching triangle used in the analysis performed according to the invention.

This method involves computing simultaneous switching noise by associating a characteristic triangle, as shown in FIG. 2, with each driver application configuration. An application configuration is a driver in a specific usage environment, including the receiver, terminator and package wiring characteristics. The characteristic triangle will roughly describe the driver's switching effect. It is essentially an approximate model of the driver's current flow over a short time during its transient stage. Each driver within the scope of the current analysis boundary will have a characteristic triangle. The height of the triangle, as well as the pitch of the sides of the triangle will be determined by the characteristics of the net. The variables a, b and c are individually specifiable based on technology characteristics. In the early stages of design, a default characteristic triangle is defined for each technology type. A general triangle also needs to be defined for cases where early analysis needs to be performed prior to choosing a technology. The approximate switching time for each driver is a required input to the simultaneous switching process. This value is a major factor in deriving the shape of the characteristic triangle in terms of the variables a, b and c. These values are derived from the switching curve of each driver type. The approximate switching time for each driver is a required input to the simultaneous switching process. This value is a major factor in deriving the shape of the characteristic triangle in terms of the variables a, b and c. These values are derived from the switching curve of each driver type. Each technology has a default driver type for drivers that have not been fully defined yet. This default driver type uses the default values of a, b and c for this technology. An unlimited number of driver types may be specified. The primary factor determining the values of a, b and c is the rate of change of current as a function of time, di/dt. For greater accuracy in high performance applications, each driver may have a family of characteristic triangles. In such a case, there is a different characteristic switching triangle for each potential termination type for a driver. This is an option for greater accuracy where required, but not a requirement for support of low end and mid-range applications.

The more drivers that switch at a specific time, the greater the magnitude of the noise that may be generated. By knowing the actual arrival time (AAT) that each driver will switch, we can plot a graph of driver switching times over the cycle time of the machine. The AAT values are provided by system timing analysis. System timing support is assumed to be present. In the most general ease, a graph can be plotted across the cycle time of the design with a unit step function for each driver. The use of characteristic triangles rather than unit step functions will provide greater accuracy.

Figure 3:
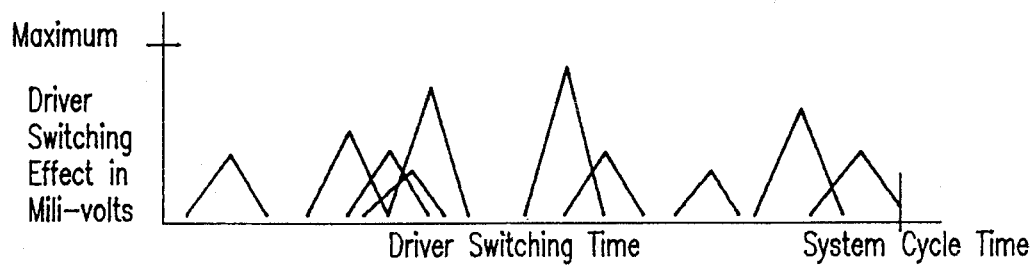
FIG. 3 is a graph of multiple drivers simultaneous switching activity.

FIG. 3 depicts a set of characteristic triangles for a set of drivers over time. This graph is representative of any one component on a higher level package, which could be a chip on an MCM (multichip module), a SCM (single chip module) on a card, or any other packaging combination. Note the differing triangle sizes, denoting different driver switching characteristics. The varying shapes represent data that is likely to be found during the detailed analysis stage, rather than the early analysis stage. This more detailed graph is included to improve the clarity of the example, and is not reflective of the level of detail that will be available for early analysis.

By summing up the magnitude of all triangles at each instant or step in time, we can graphically represent the simultaneous switching activity within a defined design boundary. Based on technology considerations, we can then assess whether or not the current switching activity exceeds acceptable limits. An example of a switching magnitude curve over time for a component is shown in FIG. 4.

Figure 4:
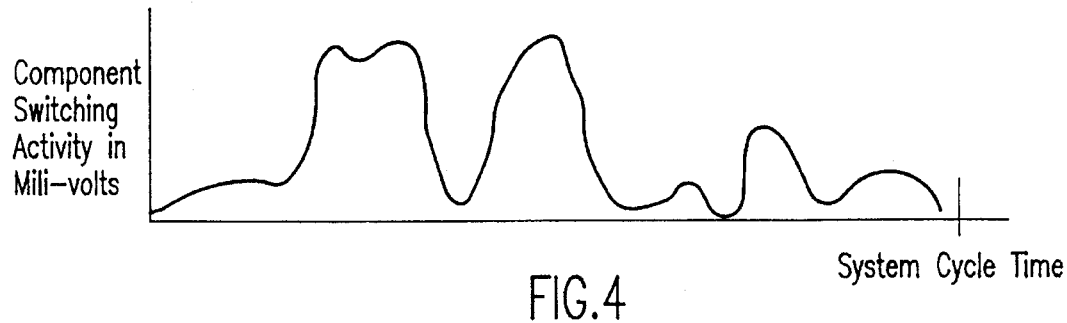
FIG. 4 is a graph of a component switching magnitude curve.

A switching curve similar to the one in FIG. 4 is created for each component on a given package, independent of each other component. Note that this is only an intermediate step, and not an end product. The switching of each component, by itself, is generally not sufficient to determine the total switching activity in an area. Generally, there is coupling of the switching effects between components that are located in close relative proximity to each other.

The earliest high level approximations assume that all drivers are located at the center of the component. These operate very quickly. Later the program provides additional granularity. The second step towards improved granularity assumes that each component is broken down into quadrants, for larger packages or chips. An additional level of granularity assumes that all drivers or each type are uniformly distributed will give maximum pre-physical design (PD) accuracy, but at a high program performance cost. If the designer has specified in their high level design that specific busses reside in specific subdivisions of the component, those will be honored, as will post PD placement details for components and pins.

The switching interaction between components generally needs to be considered. Note that this interaction is currently only considered when the components are mounted directly on the package in question. For example, surface mounted chips on a card or an MCM will show coupling effects. Chips mounted on SCMs (surface mount card modules) that are mounted on a card show minimal coupling effects. They will therefore not be considered in this analysis. The equations for which the percentage coupling is computed verify that these coupling effects can be ignored. The computation of these effects will be described subsequently. As the computation of the interactive coupling effects is described below, it will become clear that we can improve our accuracy over previous methods by using the new equations to assess when to consider coupling.

In the past, for packages with components located in congruent rows and columns, a nine component window is created. This method allowed for fairly fast computations for such neatly arranged components, but did not effectively support the required flexibility for support of generic components randomly placed on a package.

In the case where the components on the package are not evenly spaced, there was no previous methodology. The packages that had these types of layouts were simply not supported. Ideally, one methodology should support both the symmetrical congruent layout scenario, as well as the uneven layout scenario. The new methodology described here effectively supports both cases for computing partial coupling between neighbors.

Figure 5:
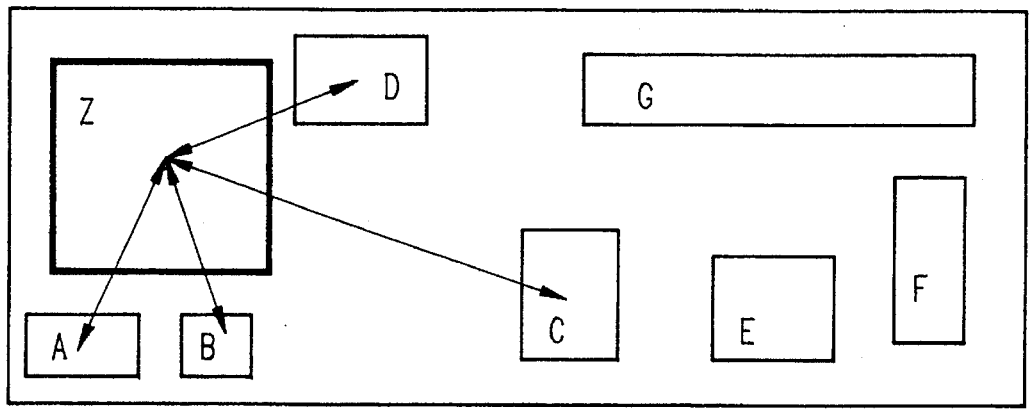
FIG. 5 is a plan view of components of a package illustrating an example of a high level noise coupling assessment in the practice of the invention.

In FIG. 5 several components are represented on a package. The component Z in bold outline is the one to be assessed. Note that all aspects of this methodology supports symmetrical congruent layout patterns. We have chosen a complex layout to focus on the support for the more complicated case.

First, we must compute the switching activity resident on our chip. To perform this task, we take the list of drivers on the package, and plot their respective switching triangles, as before. On the first pass, we assume that all component input/outputs (I/Os) are located at the center of the component. Additional granularity will be supported by subdividing the chips into portions, perhaps down to the per I/O level. Note that we can take advantage of bus specifications to speed up our computation. In the early stages of design, there will be few, if any, single nets. Most nets will be grouped in buses. This allows us to simply multiply the switching effect of one of the drivers of the bus by the number of drivers in the bus. This is done for each bus. Then the product of each of the buses is summed together along with the switching activity of any drivers that are not in buses. This simplifies the computation, eliminating the need for a more complex summation process. This gives us the switching characteristic curve of the individual component. The default number of sampling points that is used to describe this and all other such curves is twenty-four. This meets the needs of most designs. The designer will have the ability to modify this number.

Next, we compute the coupling effect of each relevant neighboring component on the current component. Currently, we are assuming that all I/Os are at the center of the component. In the following discussion, the length will be the same for all nets in a bus, and for all buses between adjacent chips. Note that as more granularity is employed, the lengths will vary. This will not effect the computational aspects of this algorithm, although it will effect the CPU usage at run time. Trade-offs will need to be made between processing time and resulting accuracy. As usual, they are inverse properties.

Simultaneous switching is now computed on a driver by driver basis. In the most detailed approach, we first compute the effect of each driver based on the current component. Then we compute the effects of each driver on each coupling neighbor on each driver individually on the current component. If we have five nets on each of the six neighbor components, and nets on component Z, we will sum 150 coupling curves. There are thirty total nets on all of the neighbors, and each of those thirty nets will be coupled with each of the five nets on component Z, thus yielding 5×30= 150 computation curves, each to be summed together into a final coupling curve for component Z. As we proceed, the furthest driver's effects becomes minimal and, therefore, is excluded from the computation.

The coupling equation for a single driver on another driver based on their relative positions is discussed in this section. Due to the inverse relationship between distance and coupling effect, as the distance between drivers increases, the coupling effect decreases. Due to the exponential inverse effect, as distance increases the coupling effect quickly approaches zero. We will apply this concept to FIG. 5. Let us look at the case of components Z and A and their coupling effects. Assume that all drivers are located at the center of the components and the length between their centers is d. We need to perform a double summation over all drivers on component Z and all drivers on component A. Thus, if we have five drivers on each, we effectively have 5×5=25 times the total effect, assuming all drivers are of the same type. Thus, in this case, $25 \times 10^{-d}$ will be the value of the coupling of all drivers on component A with component Z. If d were equal to 5 mm, then the percent coupling effect would be 17%. If d were 10 mm, the percent coupling effect would be 0.1%. If there were several bundles, they would be similarly combined and computed. In the most detailed analysis, the summation will be over each driver and its respective effect. Note that these coupling effects are applied as a percent for each point an a driver's switching curve. Thus, the computed value will be multiplied by each or the forty points and the respective driver's switching curve. Once the process of determining the coupling effects for each driver or set of drivers is complete, then the summation over all curves can be performed.

As the distance increases, we find that the coupling effect decreases and approaches zero. To optimally take advantage of this effect, we compute coupling in order from the nearest neighbor to the furthest neighbor. When we reach the point that the effect of the current component is negligible, then those more distant components certainly have no useful effect, and we may stop our computation. For each package type, as the coupling effect percent falls below 1% additional, computations cease.

Figure 6:
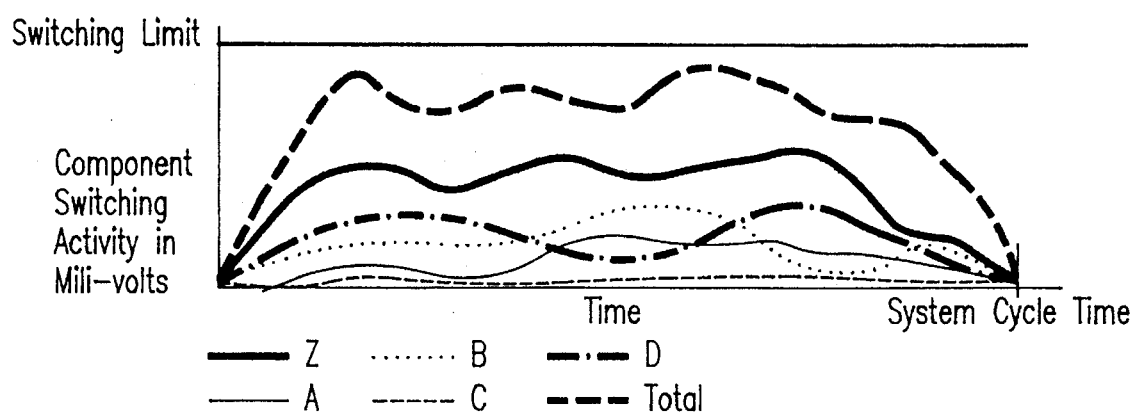
FIG. 6 is a graph showing the contribution of noise for component Z in package shown in FIG. 5.

Referring back to FIG. 5, let us break down the effects of each component. We see that component Z has nearby neighbors A, B, C and D. For the sake of brevity, we will assume that components E, F and G do not account for a notable magnitude of switching activity in the region of component Z due to their relative distances from component Z. In this case, component Z will have the greatest magnitude of effect on itself. Components A, B and D and will have the next most significant effects, and component C will have the least effect, due to its greater distance from Z. FIG. 6 shows how each of these components could have effected the switching activity in the region of component Z and the total summed effect of all components. Note that component C's curve has a very low amplitude for its duration due to its distance from component Z.

In designing an early design analysis tool, one of the goals is to minimize the number of technology inputs. In our preceding discussions, we have defined four required technology inputs. It is envisioned that upon entering the analysis tool, there will be a means of choosing one's technology type. For example, whether one is using an MCM, card, or board, and if the technology type is CMOS, bipolar, or other. From this data, a master defaults table can be accessed to determine the default values for this package.

The required input values are as follows:

1. Switching limit per component for this technology, this is the maximum allowable switching activity for a component on this package. This value is compared against the switching activity summation graphs that have been discussed above.
2. The default shape of the switching triangle (early values of a, b and c are known).
3. Timing slack data.
4. System cycle time (user input).
5. Global routing data.

By providing these technology input values, and the pre-PD physical projections, early simultaneous switching analysis may be performed. Pre-PD projections are based on layout data and global routing information. It is assumed that a system timer and global router will be in place and accessible to this function and that the output from each of these external functions will be accessible.

The simultaneous switching limit is typically half of the driver output voltage swing and a percent factor to consider the effects of hysteresis. The factor is generally 5% to 10%. As a default, we use 10%. The unit of this value is volts and is typically calculated as (0.5)×(driver output voltage swing)×(1.1).

The analysis program returns a large multi dimensional array of positive real numbers. The values in the array are representative of the switching activity at a given point in time for either a current component, coupling from a neighbor, or total. The data structure is as follows:

---

Dimension 1: Curve Magnitude Data Points

[name of coupling component]
    [data point 1]
    [data point 2]
    [data point 3]
    .
    .
    .
    [data point 40]
        Dimension 2: Component Coupling Data

[name of current component]
    [element 0 of type {dimension 1} total combined coupling effect
    [element 1 of type {dimension 1} effect of current component on self
    [element 2 of type {dimension 1} coupled effect of 1st neighbor
    [element 3 of type {dimension 1} coupled effect of 2nd neighbor
    [element 4 of type {dimension 1} coupled effect of 3rd neighbor
    .
    .
    [element n of type {dimension 1} coupled effect of (n-1) th neighbor
        Dimension 3: Components on Package data   [element 1 of type {dimension 2} component 1
data   [element 2 of type {dimension 2} component 2
data   [element 3 of type {dimension 2} component 3
    .
    .
data   [element n of type {dimension} 2 component n

---

The array structure is defined as follows:

1. Dimension 1: This dimension contains the forty points in time. It contains a magnitude for the switching magnitude at each of the forty points in time for either a current component, the coupling effect of a neighbor on the current component, or the summation. The array has one field describing the components it describes. The field is a character field, and its length is the maximum length of the longest possible component name in the system. It is called the coupling component field. For results or a component's effect on itself, the name in the character field is blank. For the values representing the total effect on a component from itself and its neighbors, the field is blank. For cases where the values represent the effects or coupling from a neighbor on the carrion component, field contains the name of the component providing neighborly coupling.

2. The second dimension is the components that effect the current component. For each component, there is a zeroth element which contains the total effect of the current and coupled components on the current component. The first element is the current component's effect on itself. The second to Nth elements are the coupling effects of the surrounding components on itself. This dimension contains the name of the current component. The first data element in this structure contains the name of the current component followed by elements of dimension 1.

3. The third dimension is components on the package. For each component, we must compute the effects of that component on itself, and the effects of its neighbors on it. For each component on the package, this dimension has one entry.

Figures 7, 8:
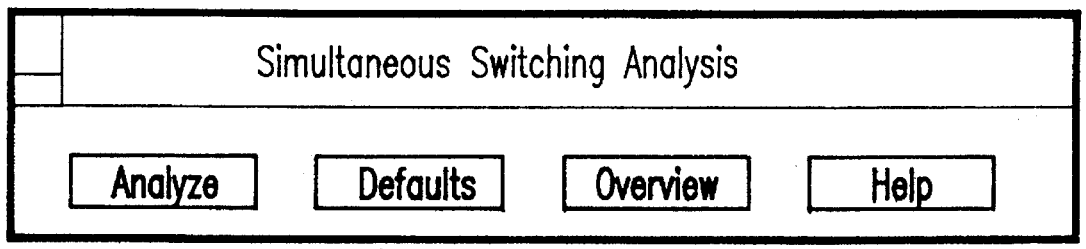
FIG. 7 is a facsimile of the simultaneous switching main menu as displayed on a computer screen.
FIG. 8 is a facsimile of the switching defaults menu as displayed on a computer screen.

The main menu of the user interface for the computer program is shown in FIG. 7 and provides the following options:

1. Perform simultaneous switching analysis (Analyze);
2. Modify defaults (Defaults);
3. Functional overview (Overview); and
4. Help.

Each of the options are buttons that can be clicked on using a pointing cursor controlled by a mouse. If the first option is clicked, all informational message will appear stating "Simultaneous Switching Analysis In Progress". If the second option is clicked on, the modify defaults menu shown in FIG. 8 will appear. This menu allows the user to click on any of the defaults and choose from a set of alternatives from an additional pop up menu. The option chosen will then appear on the main defaults menu. Each default will have a clickable option for self entry. To modify any of the parameters, the user clicks on the field that he or she desires to modify. The numeric fields will then allow them to edited. The text fields, (package type and analysis granularity) display pop up windows when clicked on. The pop window for package type may contain, for example, the following options:

1. card on backplane
2. chips on MCM
3. SMCs on card

When "OK" is clicked, the menu entries are applied to the current run, and the user is returned to the main simultaneous switching menu shown in FIG. 7. When cancel is clicked, any entered data will be ignored, and the user is returned to the main simultaneous switching menu. When help is clicked, a pop up menu appears that describes each of the fields in this menu and how to use them.

Figure 9:
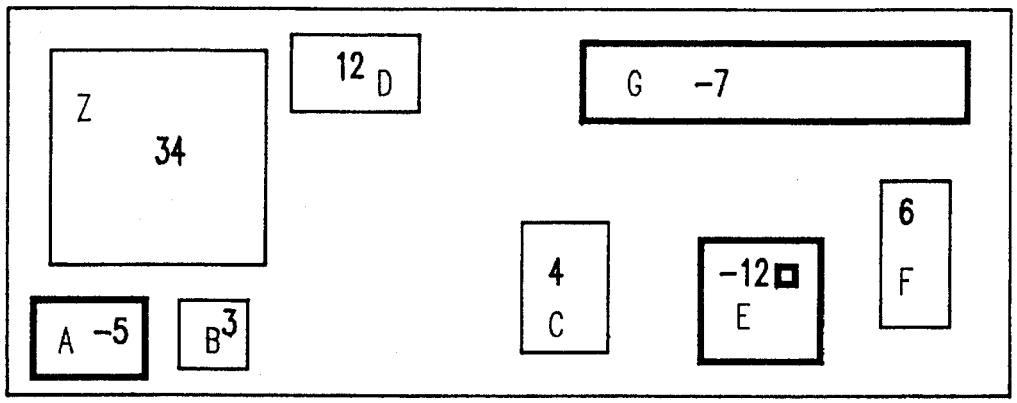
FIG. 9 is a facsimile of the plan view shown in FIG. 5 as displayed on a computer screen showing simultaneous switching results.

The following support is required with relationship to the defaults:

1. reading in of the rules containing the default data
2. determining if the default has been changed
3. determining if new default options have been added
4. saving a local personalized version of the defaults if there have been changes and/or additions
5. determining which defaults file to read in for future sessions, if there are multiple available The output is the most important part of the function. The following methodology provides the user with an easy means of seeing their results and makes them better equipped to interactively resolve resulting concerns. The first order results are in the form of a component map such as shown in FIG. 9. For each component, there will be a maximum switching activity value. This may be at any point on the curve over the cycle time. The difference between this value and the switching limit will be the absolute switching tolerance. If the maximum actual switching value exceeds the switching limit, then the difference between the maximum actual switching and the switching limit will be negative. This value will be displayed as a signed real number within each component on the map and/or as a list by components. For components where the tolerance is positive, knowing that the value is positive is sufficient to indicate that no problems exist at or around that component location. For components with a negative tolerance, this is sufficient indication that there is a noise problem at that location. It is not sufficient to know that there is only one problem. In cases where the tolerance is negative at more then one node of the switching curve, a solid square will be displayed following the negative number in the component. Note that the components with negative switching margin values are highlighted, for easier viewing. If the solid square is clicked on, then the list of all negative nodal values will be displayed. Clicking on any chip (outside of the solid box) will cause a window to open up and display the complete two curve switching map for that component. The next step is for the designer to be able to "process" offending groups of nets. This may involve adding delay padding to offending nets that are not critical. It may involve rerouting wired nets by hand to shorten paths. Any number of engineering changes may be performed. Once the designer determines that there are offending groups of nets, as denoted by the switching curves, they will want to process them.

Figure 10:
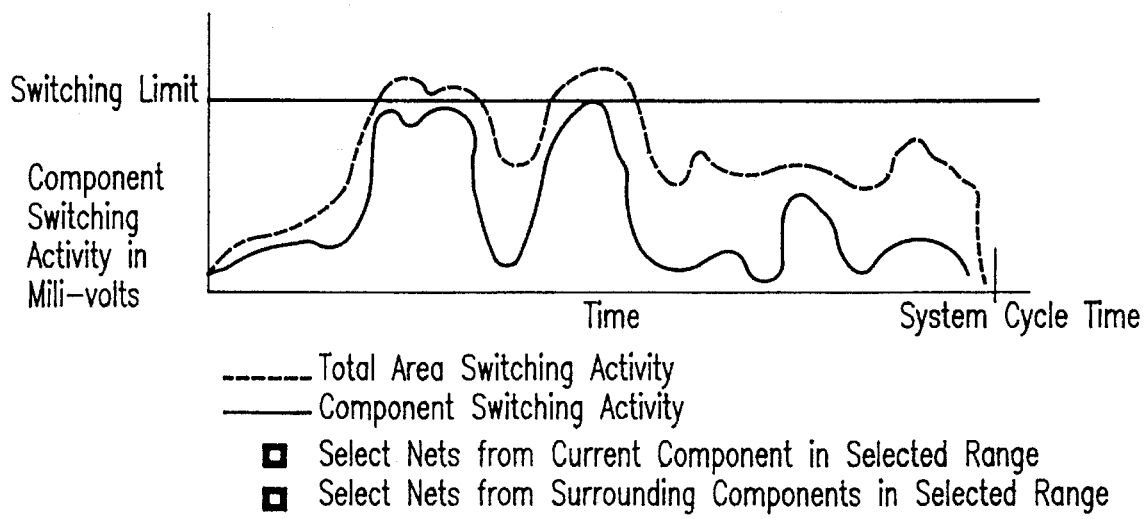
FIG. 10 is a facsimile of the simultaneous switching component results graph accessed by clicking on a component in the display shown in FIG. 9.

In some cases, the designer will want more detail than is available in the above presentation. This additional data will be provided in the form of a pair of curves. When the designer clicks on a given component, a graph window will open up with two curves on it, as shown in FIG. 10. The first curve represents the component's effect on itself, without considering the contribution of its neighbors. The second curve, displayed on the same graph, will be the total switching activity in the vicinity of the current chip, including both the switching effects of the current chip on itself, and the effects of the surrounding chips that couple with the switching of the current chip. The second curve will clearly be greater in magnitude than the first curve, barring special case situations. Note that this figure can only represent component E above, since this curve has two points that exceed the allowable switching limit, and component E above contains a solid square that indicates there are multiple points of failure. The difference between the two curves is the switching contribution due to coupling effects by neighboring components. Note the areas of the graph where the total switching activity for the component region exceed the maximum switching limit.

In addition to the two curves that come up when the designer clicks on a component as shown and discussed above, there are also curves available describing the effects of each numerically relevant neighbor on the current component. The designer may click on an option to create a pop up window containing a list of all of the available neighborly coupling curves. They may then select some or all of these curves to be displayed via marking them include or exclude. When selection is complete, then a button will activate the graph creation function and put up the graphs.

The designer is able to hold down the mouse button and create a box about an area of the curve. The nets that switch at the times enclosed in this box are then grouped together for further analysis and processing in other functions outside of simultaneous switching analysis, in other windows. This allows the designer to fix their problems. Then they can rerun the analysis and see the effect real time.

When debugging simultaneous switching problems, it is valuable to select nets from the current component in a given time slice and/or neighbors of the current component. These options are at the bottom right of the menu. Each of these options can be turned on or off. This allows visual display of where the coupling effect originates by selecting the option to operate on nets from surrounding components and then drawing that set of nets. This presents a clearer effect the prime causes, if any, of coupling from neighbors. This process is iterative, real time, and continues until all excessive switching activity has been resolved.

Figure 11:
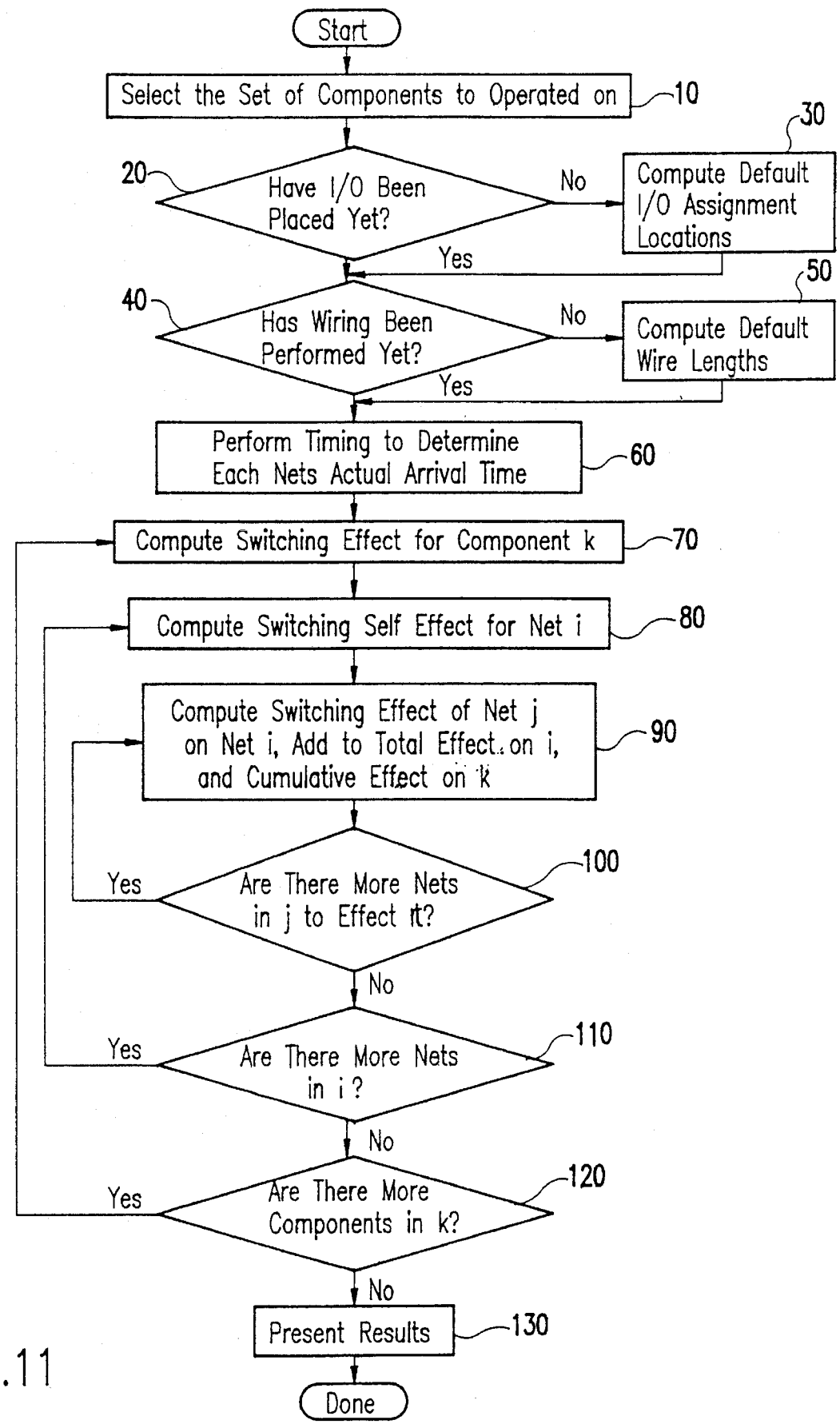
FIG. 11 is a block diagram showing the architecture of the simultaneous switching program according to the invention.

The logic of the program architecture is shown in flow diagram of FIG. 11. The process begins by selecting the set of components to be operated on in function block 10. A test is made in decision block 20 to determine if the I/Os have been placed yet. If not, the default I/O assignments are computed in function block 30 before the process continues; otherwise, the process goes directly to decision block 40 to determine whether the wiring has been performed yet. If not, the default wire lengths are computed in function block 50 before the process continues; otherwise, the process goes directly to function block 60 where timing is performed to determine each net's actual arrival time.

At this point, the process enters a set of nested loops. The switching effect for component k is computed in function block 70, the switching self effect for net i is computed in function block 80, and then the switching effect for net j on net i is computed and added to the total effect on net i and the cumulative effect on component k in function block 90. Once these computations have been made, a first test is made in decision block 100 to determine if there are more nets j to effect net i. If so, the process loops back to function block 100. If not, a test is made in decision block 110 to determine if there are more nets i. If so, the process loops back to function block 80. If not, a test is made in decision block 120 to determine if there are more components k. If so the process loops back to function block 70. If not, the results are output in function block 130, and the process ends.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of early high level net based analysis of simultaneous switching in circuit designl comprising the steps of:

associating a characteristic triangle with each driver application configuration, where a driver application configuration is a driver in a specific usage environment, including a receiver, terminator and package wiring characteristics, said characteristic triangle being an approximate model of a driver's current flow over a short time during its transient switching stage and derived from a switching curve of a driver type;

summing magnitudes of all triangles at each instant or step in time and graphically representing the simultaneous switching activity within a defined design boundary; and using the graphical representation of the simultaneous switching activity to determine whether switching activity of the present design exceeds acceptable limits.

2. A method of early high level net based analysis of simultaneous switching in circuit design as recited in claim 1 further comprising the steps of:

providing default information on characteristic triangles for a plurality of technology types;

selecting a technology type for the circuit design; and reading default information for the selected technology type in the step of associating a characteristic triangle with each driver application configuration.

3. A method of early high level net based analysis of simultaneous switching in circuit design as recited in claim 1 further comprising the step of performing a system timing analysis to determine an actual arrival time each driver will switch, said step of summing magnitudes of all triangles taking into account the actual arrival time of each driver in the graphical representation of the simultaneous switching activity.

4. A method of early high level net based analysis of simultaneous switching in circuit design as recited in claim 3 wherein the step of associating a characteristic triangle with each driver application configuration comprises the steps of:

computing a switching effect for each component k in a driver application configuration;

computing a switching self effect for each net i;

computing a switching effect of net j on net i; and adding a total computed switching effect on net i and cumulative switching effect on each component k.

5. A method of early high level net based analysis of simultaneous switching in circuit design as recited in claim 3 further comprising initial steps of:

selecting a set of components to be analyzed as part of the early high level net based analysis;

determining if inputs and outputs (I/Os) of a circuit design have been placed and, if not, computing default I/O assignment locations; and determining if wiring has been performed and, if not, computing default wiring lengths, said initial steps being performed before the step of performing a system timing analysis.

6. A method of early high level net based analysis of simultaneous switching in circuit design as recited in claim 5 further comprising the steps of:

providing default information on characteristic triangles for a plurality of technology types;

selecting a technology type for the circuit design; and reading default information for the selected technology type in the step of associating a characteristic triangle with each driver application configuration.

7. A method of early high level net based analysis of simultaneous switching in an early stage of circuit design for a plurality of components mounted on a package comprising the steps of:

computing switching activity resident on each component;

computing a coupling effect on each relevant neighboring component for each component of the circuit based on a distance between components;

computing simultaneously switching effects on a driver by driver basis in the circuit;

graphically displaying characteristic triangles representing an approximate model of a component's current flow over a short time during its transient switching stage and derived from a switching curve of a driver type, said triangles being displaced from one another according to actual arrival times of switching effects; and determining form the graphical display whether switching activity of the circuit design exceeds acceptable limits.

8. The method of early high level net based analysis of simultaneous switching recited in claim 7 wherein the step of computing a coupling effect initially assumes that all inputs and outputs (I/Os) of circuit design are at a center of a component.

9. The method of early high level net based analysis of simultaneous switching recited in claim 7 wherein the step of computing a coupling effect is performed by a double summation of all drivers on one component and of all drivers on each relevant component.

10. The method of early high level net based analysis of simultaneous switching recited in claim 9 wherein the double summation is inversely proportional to a mathematical power of distance between components.

* * * * *